United States Patent [19]
Rutt

[11] 4,071,880
[45] * Jan. 31, 1978

[54] CERAMIC BODIES WITH END TERMINATION ELECTRODES

[75] Inventor: Truman C. Rutt, Niagara Falls, N.Y.

[73] Assignee: N L Industries, Inc., New York, N.Y.

[*] Notice: The portion of the term of this patent subsequent to June 14, 1994, has been disclaimed.

[21] Appl. No.: 660,522

[22] Filed: Feb. 23, 1976

Related U.S. Application Data

[60] Division of Ser. No. 478,181, June 10, 1974, Pat. No. 3,965,552, which is a division of Ser. No. 274,668, July 24, 1972, abandoned, which is a continuation-in-part of Ser. No. 134,689, April 16, 1971, Pat. No. 3,679,950.

[51] Int. Cl.$^2$ .................. H01G 1/14; H01G 4/12
[52] U.S. Cl. ........................... 361/309; 361/321; 428/192; 428/136
[58] Field of Search .............. 428/188, 192, 134, 136; 174/68.5; 317/258, 261; 361/309, 321

[56] References Cited

U.S. PATENT DOCUMENTS 3,561,110  2/1971  Feulner et al. .................. 174/68.5
3,679,950  7/1972  Rutt ................................ 317/258

OTHER PUBLICATIONS

Rutt, et al., "Fabrication of Multilayer Ceramic Capacitors by Metal Impregnation", in IEE Transactions on Hybrids, vol. PHP No. 9, 9/73.

Primary Examiner—Elliot A. Goldberg
Attorney, Agent, or Firm—Ashlan F. Harlan, Jr.

[57] ABSTRACT

A sintered ceramic article which comprises internal electrodes and/or conductors is formed by producing a sintered ceramic body that has areas of ceramic material extending to an outer face thereof, said areas having an open structure characterized by interconnected voids, and thereafter providing a conductor in said porous areas. The ceramic body may be formed by depositing, for example by screen printing, on sheets of a powdered dielectric or insulating ceramic material bonded with a temporary bond, an area of a temporarily bonded powdered ceramic material which on firing becomes porous, i.e. open-structured, consolidating a plurality of such sheets, and sintering them. Subsequently, electrodes or conductors may be provided in the open-structured areas by impregnating said areas with a metal or alloy and providing a termination electrode on the said outer face. If desired, an open-structured permeable barrier can be provided on said outer face before such impregnation. The barrier may be either a porous ceramic or a porous conductive coating which serves as a termination electrode.

10 Claims, 8 Drawing Figures

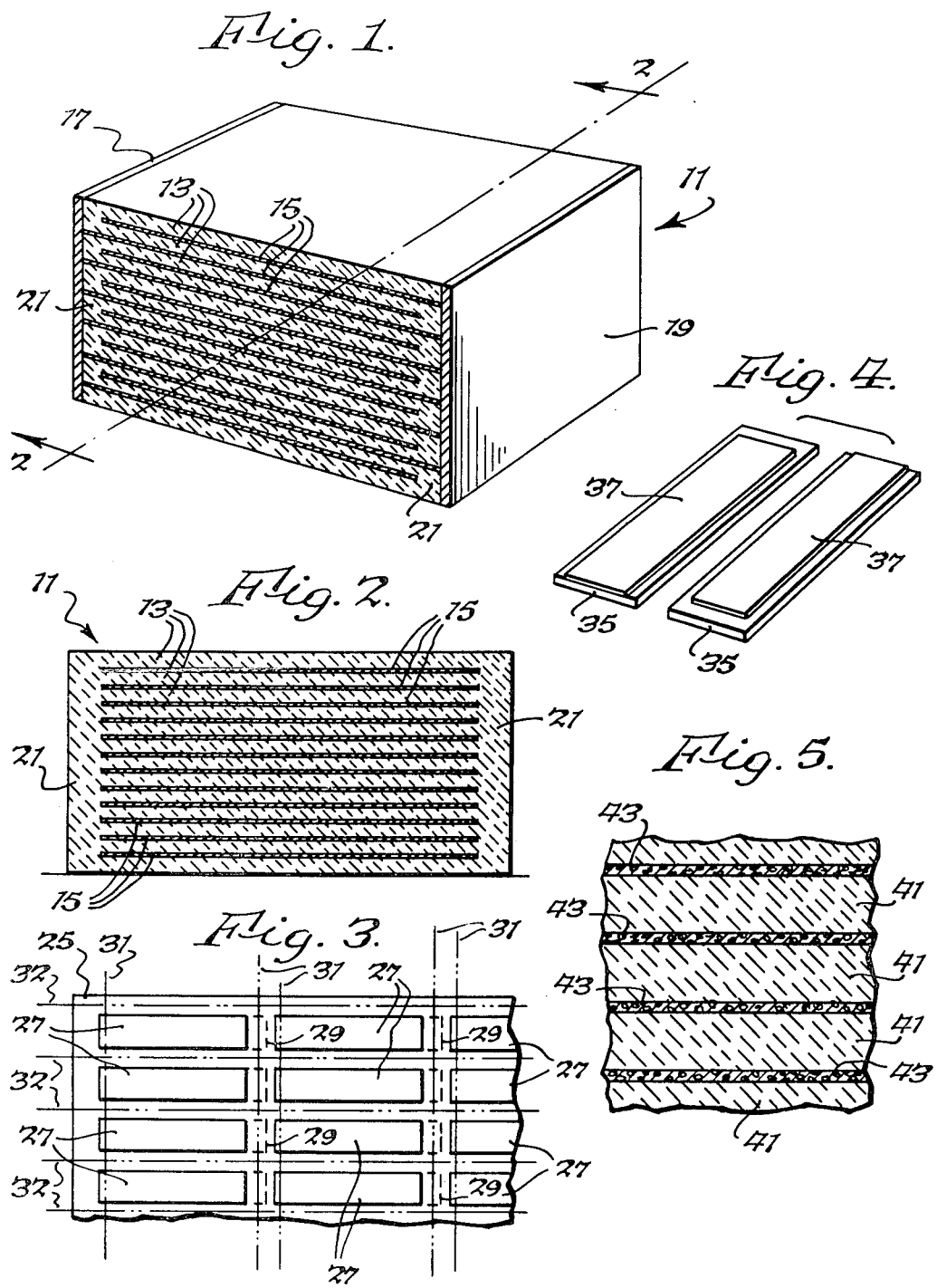

CERAMIC BODIES WITH END TERMINATION ELECTRODES

BACKGROUND OF THE INVENTION

This application is a division of application Ser. No. 478,181 filed June 10, 1974 (now U.S. Pat. No. 3,965,552, June 29, 1976), which was a division of application Ser. No. 274,668, filed July 24, 1972 (now abandoned), which was in part a continuation of Ser. No. 134,689, filed Apr. 16, 1971 (now U.S. Pat. No. 3,679,950, July 25, 1972).

The invention of the present application and the prior application Ser. No. 134,689, relates to the formation of electrodes and/or conductors in ceramic dielectric or insulating bodies and is particularly concerned with the provision of such electrodes and/or conductors by a procedure which obviates the necessity of firing them at the same time that the ceramic bodies, with which they are associated, are fired. Examples of products which may be produced in accordance with the invention are monolithic capacitors and multi-layer circuit structures such as are used for hybrid integrated circuits.

Ceramic capacitors have been in use for many years and for many purposes have replaced paper, mica, and other types of capacitors because of the relatively high dielectric constant of barium titanate and certain other available ceramic materials. This has permitted the production of high-capacitance, miniaturized bodies; and high-speed pressing procedures have been developed to reduce production costs. However, there has still been a demand for even higher capacities in very small bodies. Multilayer, monolithic, ceramic capacitors have been produced to meet this demand.

While there are many variant processes in use for the production of such monolithic, ceramic capacitors, in a typical process a doctor blade is used to cast on a smooth, non-absorbent surface, a thin layer of a suitable ceramic dielectric composition mixed with a solution of an organic binder. After the layer dries, the resultant sheet may be cut into small pieces of rectangular shape to which an electroding paste of a noble metal such as platinum or palladium is applied by a silk-screening procedure in such a way that a margin is left around three sides of the metal coating, but the electrode paste extends to one edge of the small sheet. A plurality of the sheets with electrode paste thereon are then stacked with alternate sheets having the electrode paste extending to opposite edges. The stack of sheets is then consolidated and heated to drive off or decompose the organic binders of the sheet and the electroding paste and to sinter the dielectric composition into a unitary body having electrodes exposed alternately on each end so that those exposed at each end may be connected together electrically by metallizing the ends of the body. Thus, there is obtained a capacitor which may have from a few to a great number, 50 or more being common, of very thin (often 0.05 mm or less) ceramic dielectric layers. Such capacitors have very high capacitance densities and thus the use of extremely small units in many circuits is permitted.

It may be seen from the foregoing description that considerable expense is involved in the production of monolithic ceramic capacitors because of the necessity for using noble metal electrodes. Silver electrodes, such as are commonly used with other ceramic capacitors, are generally unsuitable therein because firing to a high temperature is required after the electrodes are applied.

It is, accordingly, one of the objects of the present invention to provide a process by which the cost of monolithic, ceramic capacitors may be reduced by eliminating the use of noble metal electrodes.

Another object of the present invention is to provide a procedure for making ceramic articles having conductive areas therein which does not require the firing of the conductive material at the same time the ceramic article is formed by firing.

It is also an object of the present invention to produce multilayer circuit structures for hybrid integrated circuits in which conductors for attachment of components are provided at various levels in a ceramic substrate or matrix.

SUMMARY OF THE INVENTION

The first two of the above-stated objects are achieved by forming a sintered, monolithic, ceramic body which comprises a plurality of thin strata. The strata are of two types, strata of one type being dense and impervious and being formed of ceramic dielectric material with a relatively high dielectric constant, and strata of the other type being of ceramic material having an open structure characterized by interconnected voids. Strata of one type alternate with strata of the other type through the thickness of the body. This structure can be achieved by introducing between sheets of a powdered ceramic dielectric composition bonded with a temporary bond, a deposit of a temporarily bonded, powdered ceramic material that on firing develops the desired open structure, consolidating a plurality of such sheets with intervening deposits, as described, and firing the consolidated mass to sinter it. Such deposits may be formed in situ, for example by screen printing or painting, or may be preformed leaves or films. Alternate ones of such open-structured strata extend to a pair of different edge regions of the sintered body; but since the deposits of the second-mentioned ceramic material, and thus the open-structured strata, are smaller in area than the dense dielectric strata, the other edge regions of the fired body and the interior thereof immediately adjacent the latter-mentioned regions are composed exclusively of the dielectric material.

The monolithic ceramic body, after being sintered by firing, is converted to a capacitor by introducing a molten metal into the open-structured strata within the body to form internal electrodes. When the terms "open structure" and "open-structured" are employed herein with reference to a body or portions thereof, it is meant that the body or portion so characterized or described has enough voids of sufficiently large size and sufficient interconnection between such voids as to permit, in most cases, the infiltration of molten metal thereinto with the use of no more than moderate pressure, e.g. 35 kg/cm$^2$ or lower.

The molten metal may be introduced into such strata before termination electrodes are applied on the edge faces of the body having exposed internal electrodes and termination electrodes may be applied in conventional or desired manner. Alternatively, a penetrable barrier, which may be a termination electrode, can be applied to each of such edge faces prior to introducing molten metal into the open-structured strata of said body and the metal can then be forced through said penetrable barriers into the said open-structured strata. If said barriers are not termination electrodes, such electrodes can then be applied after, if necessary or desired, removing all or parts of the barriers. In any event, the present invention provides a simple, relatively inexpensive and efficient method for forming monolithic capacitors having a very high volume capacitance which do not require noble metal internal electrodes and which do not require cofiring of metal and ceramic.

A very similar technique can be employed in producing multilayer circuit structures. For example, thin sheets of a powdered, ceramic, insulating material temporarily bonded with a fugitive, temporary bond are provided, by a suitable procedure such as printing, with a desired pattern of lines, pads, and the like of a ceramic composition (which may be termed a pseudo-conductor) that on firing develops an open structure having interconnected voids as with the above-described bodies. The sheets are then stacked, compacted, and fired to produce sintered bodies with predetermined open-structured areas, corresponding to the applied patterns of the pseudo-conductor, which are then impregnated with a molten metal to provide conductors in place of the pseudo-conductor.

The term "metal" as used in this specification and the appended claims is employed broadly to include not only pure and substantially pure metals, but also alloys.

SHORT DESCRIPTION OF THE DRAWINGS

FIG. 1 is an enlarged sectional view of a finished, monolithic, ceramic capacitor in accordance with the present invention;

FIG. 2 is a sectional view along the plane of the line 2—2 of FIG. 1;

FIG. 3 is a plan view of a bonded sheet of a ceramic dielectric composition having deposited thereon, in a pattern, a ceramic composition suitable for formation of an open-structured stratum;

FIG. 4 is an enlarged perspective view of two sheets of a bonded ceramic, dielectric composition, each sheet having an area thereon covered with a ceramic composition suitable for formation of an open-structured stratum;

FIG. 5 is a further enlarged, detail sectional view of a ceramic body according to the present invention after assembly and sintering of a plurality of sheets such as shown in FIG. 4;

DETAILED DESCRIPTION OF THE INVENTION

Figure 7:
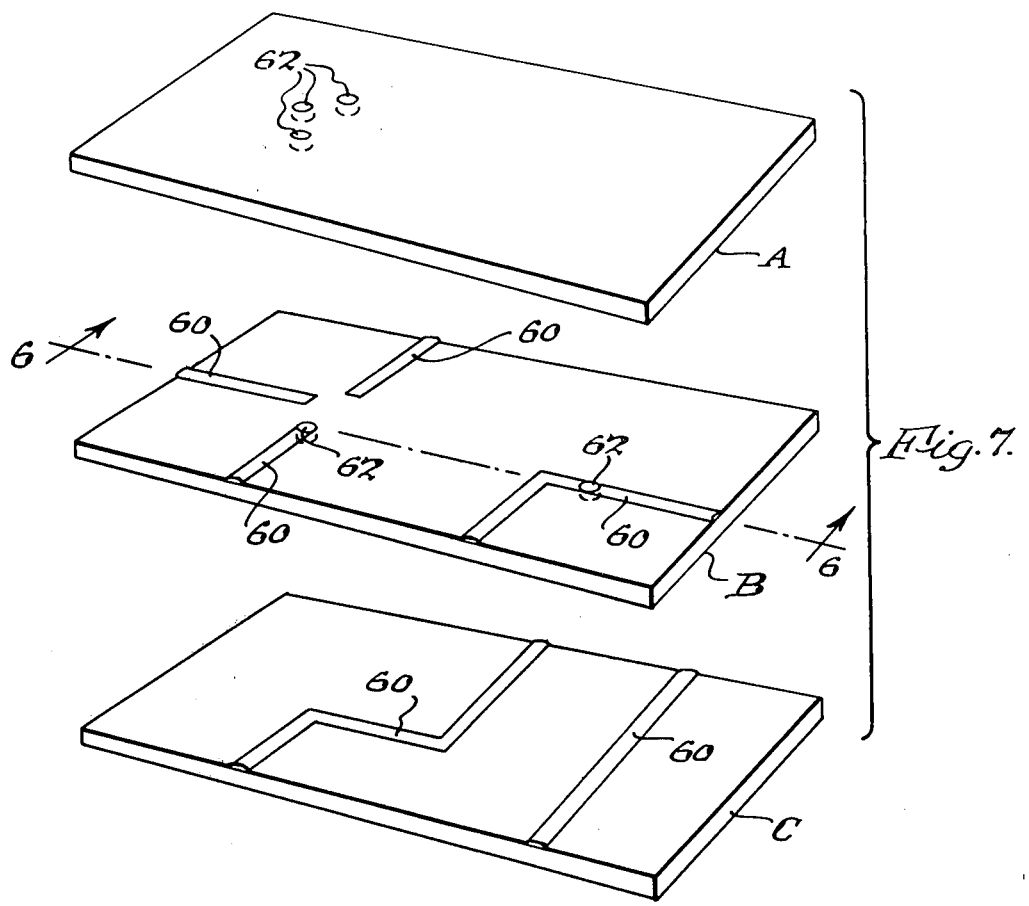
FIG. 7 is an enlarged, exploded view showing the several ceramic sheets forming the structure shown in FIG. 6 with pseudoconductors thereon.

A preferred process for preparing monolithic ceramic capacitors according to the present invention is broadly as follows:

A suitable, finely divided, ceramic, dielectric material is formed into a thin film with the aid of a suitable, fugitive, heat-removable, film-forming agent. After drying, the film is cut into sheets of suitable size. On these sheets is then applied a thin layer, film, or coating, in a desired pattern, of a suitable paste or the like containing a fugitive or heat-removable binder and a powdered ceramic composition which when fired at sintering temperatures will, instead of becoming dense and compact, form an open structure, i.e. a structure, a substantial portion of the volume of which is composed of interconnected voids. A plurality of the thus-coated ceramic sheets is assembled in stacked relation, consolidated into a block, and cut into smaller blocks or chips. The latter are heated to remove the film-forming, temporary binding agents and are then further heated to a high temperature in air to produce small, coherent, sintered bodies with dense, ceramic dielectric strata alternating with open-structured strata. In each of the chips the latter strata extend to an edge face and thus, according to the present invention, may be infiltrated or impregnated with a conductive material such as a metal or alloy. Upon suitable infiltration or impregnation, there is obtained a structure in which there are alternate layers of dielectric material and metal which, when an end or termination electrode is provided on each end to electrically connect the metal layers exposed thereon, forms a monolithic capacitor.

The drawings depict such a structure, FIGS. 1 and 2 illustrating on an enlarged and exaggerated scale a monolithic capacitor 11 having thin layers 13 of dielectric material with thinner layers 15 of conductive material such, as a metal or alloy, interposed between the layers 13. As will be seen in FIG. 1, the layers 15 are so formed that alternate ones extend to the opposite end faces of the capacitor and are there connected together electrically by metallizing the ends in a suitable, known, manner to provide the end or termination electrodes 17 and 19. Where, as shown at 21, there is no intervening conductive material, the dielectric layers 13 are united.

In FIG. 3 there is shown a film or sheet 25 of temporarily bonded dielectric material on which a paste or the like, containing a fugitive binder and a ceramic composition which on firing to sintering temperatures will form an open structure, has been printed in small areas 27 to form a pattern.

In FIG. 4 there are shown, enlarged, two small thin sheets 35 of dielectric material bonded with a fugitive bond, each of the sheets 35 having thereon a layer, film, or coating 37 of a temporarily bonded, ceramic composition that on firing will form a sintered open structure. The sheets 35, which may be formed individually or by appropriate cutting of larger sheets such as the sheet 25 (FIG. 3), are arranged so that when superimposed or stacked the ends of the layers 37 that extend to the edges of the sheets will be at opposite ends of the stack. When a plurality of such sheets are stacked and fired at sintering temperatures a structure like that shown in FIG. 5 is obtained.

In FIG. 5 there is shown, further enlarged, a partial sectional view of a sintered body in accordance with the present invention with alternating dielectric strata 41 and open-structured strata 43, the latter being adapted to receive a conductive material.

Figure 6:
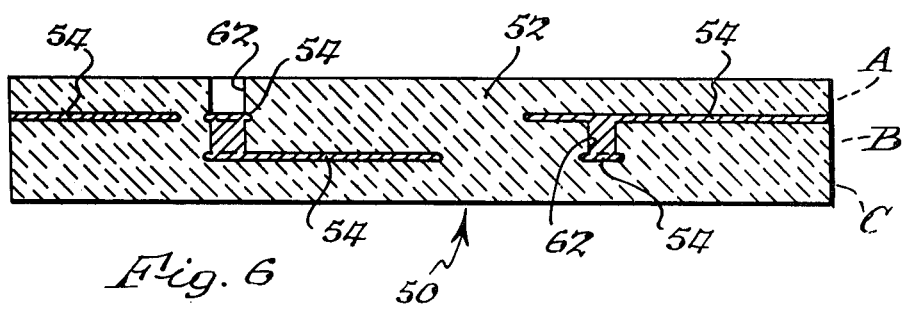
FIG. 6 is an enlarged, sectional view of a multilayer ceramic circuit structure according to the present invention.
Figure 8:
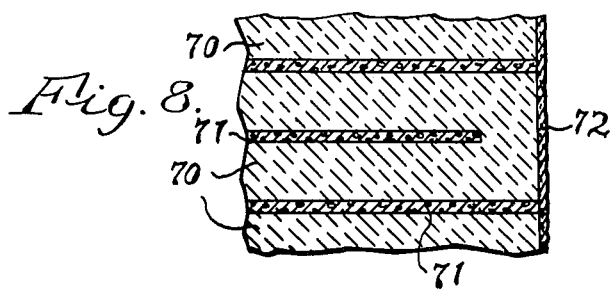
FIG. 8 is a fragmentary, enlarged, sectional view similar to FIG. 5 of a modified form of ceramic body according to the present invention.

FIGS. 6–8, inclusive, will be hereinafter described in connection with the description of the structure involved.

In the following examples, details of the production, according to the present invention, of monolithic ceramic capacitors are set forth.

EXAMPLE 1

An uncalcined ceramic dielectric composition consisting of 93% of barium titanate ($BaTiO_3$) and 7% of bismuth zirconate ($Bi_2O_3 \cdot 3ZrO_2$) is employed. A mix of 100 g of the dielectric composition in finely divided form (approximately 1.5 μm particle size) with 65 ml of toluene, 3 g butyl benzyl phthalate, 10 ml dichlorenthane, and 2 ml acetic acid is ball milled for 4 hours. To the ball milled product there is then slowly added with stirring, an additional 20 ml of dichlorethane and 4 g of ethyl cellulose. If necessary to eliminate bubbles, the stirring may be slowly continued for several hours. A film of the mixture approximately 610 mm by 102 mm in area by 0.051 mm thick is formed with a doctor blade on a sheet of smooth plate glass. When the film dries, the sheet thus formed is removed and small rectangular sheets or leaves approximately 102 mm by 51 mm are cut therefrom.

The composition for the open-structured, porous strata is formed from a second ceramic composition consisting of 66.94% barium carbonate ($BaCO_3$), 27.1% titanium dioxide ($TiO_2$), 3.32% bismuth oxide ($Bi_2O_3$), and 2.64% zirconium oxide ($ZrO_2$), all in powdered form, blended in a 1:1 weight ratio with a vehicle of the type known as squeegee media which is composed of 80 ml pine oil, 14 g acrylic resin, and 1.5 g lecithin dispersing agent to which 1.3% (based on the total weight of all other ingredients of the composition) of ethyl cellulose is added to increase the viscosity. The average particle size of the $TiO_2$ in the composition is preferably from about 5 to 10 μm and the particle sized of the other ceramic ingredients used preferably average from about 1 to 2 μm. This composition is screen printed approximately 0.038 mm thick in a recurring pattern, such as shown in FIG. 3, on the small leaves of dielectric composition formed as described above. The printed leaves are then indexed and stacked in groups of 10 so that the printed patterns on alternate leaves are offset. The broken lines 29 in FIG. 3 indicate the placement of the printed pattern on the sheets above and/or below the sheet 25 when the sheets are stacked. The stacked sheets are pressed at about 85° C and 28 kg/cm² to form blocks. The blocks are then cut, by suitable means such as knives, to form smaller blocks or chips, the cutting being done along such lines as the broken lines 31 and 32, so that in each of the smaller blocks the alternate strata of screen printed composition are exposed on opposite ends but are not exposed on the sides.

The smaller blocks are then heated quite slowly in air to drive off and/or decompose the temporary binding material in the ceramic layers and are thereafter fired at a high temperature, also in air, to form small, coherent, sintered chips or bodies.

A suitable heating schedule for removal of the temporary binding material is as follows:

| | |
|---|---|
| 100° C – 16 hours | 295° C – 2 hours |
| 150° C – 16 hours | 325° C – 1.5 hours |
| 175° C – 8 hours | 355° C – 1 hour |
| 210° C – 16 hours | 385° C – 1 hour |
| 225° C – 8 hours | 420° C – 0.5 hour |
| 250° C – 16 hours | 815° C – 0.5 hour |

The temperature is then raised to 1260° C and maintained for 2 hours to sinter the chips.

The sintered chips obtained, after cooling, may be provided with a metal or alloy in the porous strata and provided with termination electrodes on their opposite ends to obtain efficient monolithic capacitors.

In the foregoing example the porous, open-structured strata of the monolithic ceramic capacitors are essentially the same chemically as the dense dielectric layers, the porosity of the porous strata being produced as a result of the decreased volume occupied by the ceramic material used after the reaction thereof which occurs during heating. In the following two examples the porous strata are chemically different from the dielectric strata.

EXAMPLE 2

A finely divided (approximately 1.5 μm particle size) ceramic dielectric composition consisting of 98% $BaTiO_3$ and 2% niobium oxide ($NB_2O_5$) is employed. A mix consisting of 480 g of the powdered dielectric composition, 4.8 g of a lecithin dispersing agent, 12.6 g of dibutyl phthalate, and 75 ml of toluene is ball milled for 4 hours. There is then added 156 g of a 40% acrylic resin — 60% toluene solution. The mixture is slowly stirred for a period of time sufficient to increase the viscosity by evaporation of solvent and to remove entrapped air. It is then cast on a smooth glass plate in a sheet about 610 mm square and allowed to dry. The air-dried cast sheets are about 0.7 mm thick and are cut into smaller sheets or leaves approximately 102 mm by 51 mm.

The composition for the porous strata is formed from a second mixture consisting of barium oxalate ($BaC_2O_4$) and $TiO_2$ in a 1:1 mol ratio. The $TiO_2$, which comprises 26.17% of the mixture, preferably has an average particle size of about 2–5 μm. The mixture is blended in a 1:1 weight ratio wih the squeegee medium described in Example 1 and screen printed in a predetermined recurring pattern on the small leaves of dielectric material. The printed leaves are then indexed, stacked 15 high, and compacted. The thus formed blocks are cut, as in Example 1, to form a plurality of smaller blocks or chips, in each of which alternate layers of the screened-on composition extend to opposite end faces of the chips, but are otherwise inaccessible.

The chips are heated in accordance with a suitable schedule, which may be the one set forth in Example 1, to eliminate the fugitive binders and are then fired for about 2 hours at about 1325° C to sinter them. As in Example 1, the strata between the dense dielectric strata have an open structure comprising a network of interconnected pores and, as a result of the relatively greater shrinkage when the barium oxalate and $TiO_2$ react to form $BaTiO_3$, the major portion, by volume, of such strata is void. After cooling, the fired chips may be, as hereinafter described, provided with electrodes in the porous areas or strata formed between the dielectric strata and with termination electrodes by suitable procedure, thereby forming monolithic capacitors.

Even more widely different ceramic materials in the dielectric layers and porous layers, respectively, are used in the following example.

EXAMPLE 3

A mixture is made of 472.8 g $TiO_2$ (average particle size about 1.5 μm), 7.2 g Kaolin, 4.8 lecithin dispersing agent, 13.6 g dibutyl phthalate, and 75 ml toluene and this mixture is ball milled for 4 hours. It is then mixed with 124.9 g of a 1:1 acrylic resin-toluene solution and, after de-airing, is cast on a smooth glass plate with a doctor blade to a thickness of 0.2 mm to produce on drying a sheet about 0.08 mm thick which is cut into smaller sheets approximately 102 mm by 51 mm.

Using the procedure of Example 2, the smaller sheets are screen printed in a predetermined recurring pattern with a composition formed by mixing 27.58% powdered alumina ($Al_2O_3$) having an average particle size of 2.5 μm, 14.14% carbon black, and 58.27% of the squeegee medium described in Example 1. The printed sheets are then indexed, stacked 10 high, compacted, and cut to form a plurality of blocks or chips in each of which alternate layers of the screened-on composition extend to opposite end faces of the chips, but are otherwise inaccessible.

The chips are heated and then fired in substantially the same way as the chips in Example 1, a final firing for 2 hours at about 1320° C being employed. As in Example 1, the open-structured strata between the dense, dielectric, $TiO_2$ strata have a network of interconnecting pores. These result from the combustion of the carbon black and the larger particle size of the $Al_2O_3$. The porous strata can be impregnated with a metal, by one of the procedures hereinafter disclosed, and provided with suitable termination electrodes, thereby forming monolithic capacitors.

In the following example another procedure for obtaining bodies with alternate and open-structured strata is illustrated.

EXAMPLE 4

Small sheets or leaves of a resin-bonded dielectric ceramic composition are prepared in the manner set forth in Example 2. A screen printing composition is made by blending 16 g of the squeegee medium described in Example 1 with 12 g $BaTiO_3$ (approximately 4 μm particle size) and 4 g carbon black, Stoddard solvent being added as necessary to obtain the desired viscosity. This composition is then screened on the leaves in the same manner as in Example 2 and allowed to dry. Blocks and smaller cut blocks or chips are formed from the printed leaves in the same way as in Example 2 and the chips are heated and fired, also in the same way. In the course of the firing the carbon black burns out leaving an open-structure comprising a network of interconnected pores in the areas between the dense dielectric strata. The use of the relatively coarse $BaTiO_3$ in the printing composition increases the porosity. These porous areas can be filled with a metal in one of the ways described hereinafter and provided with end electrodes to form monolithic capacitors.

Still another way of forming monolithic ceramic capacitors according to the principles of the present invention is illustrated in the following example.

EXAMPLE 5

A sheet about 0.08 mm thick of a ceramic dielectric material such as the one produced in Example 2 is cut into smaller sheets or leaves approximately 20 mm by 20 mm. Another sheet of slightly less thickness, for providing porous strata, is formed by casting a composition formed from 351 g $BaTiO_3$, 7 g $Nb_2O_5$, and 115 g carbon black, these ingredients being ball milled for several hours with toluene and dibutyl phthalate and then, after admixture with a 1:1 acrylic resintoluene solution, deaired before casting. The second sheet is cut into leaves approximately 13 mm by 16 mm. The leaves of dielectric material and of the other ceramic material are then stacked 11 high. The second-mentioned leaves are alternated with the leaves of dielectric material and have their long side edges aligned and equally spaced from edges of the larger leaves. Alternate leaves of the second composition are laid in place so that the ends thereof extend to opposite edges of the dielectric material leaves. The stack is then consolidated by pressing at about 7 kg/cm² and a temperature of about 40° C and the consolidated block is heated to burn out the temporary binders and the carbon black and to sinter the ceramic materials into a structure in which open-structured, porous, ceramic strata alternate with dense, ceramic, dielectric strata. A heating schedule like that specified in Example 1 is used, the final heating, however, being at 1370° C for 2 hours, firing being in air. The fired block may be impregnated with a metal in the porous strata, thereby forming internal electrodes, by any of the procedures described hereinafter. Suitable termination electrodes can also be provided.

Although in Examples 1 – 1, the dielectric materials used are modified barium titanate compositions, it will be clear that others of the large number of ceramic dielectric compositions known may also be used. For example, $TiO_2$ (note Example 3), glass, steatite, and barium strontium niobate, as well as barium titanate alone can be used, suitable changes well known in the art being made as required in firing conditions and the like to achieve proper sintering. Obviously, the capacitance of the resulting capacitors will vary as a result of using materials with higher or lower dielectric constants.

It will also be understood that the composition of the openstructured strata in ceramic chips according to the invention may vary widely. Not only may the desired open-structure be achieved by use of a composition which is identical with or similar to the composition of the dielectric strata, although having a greater shrinkage on firing, but also the composition may be quite different, as for example, in Example 3. An open-structure may also be produced or the void volume of such structure be increased by other means, for example by employing a combustible material in the mix as illustrated in Examples 3 and 5. It is important, however to employ materials which, at the temperatures reached during heating and sintering, do not by reacting with the dielectric composition used, deleteriously affect the dielectric properties of the latter. Those skilled in the art are familiar with the effects of various materials and can readily make proper choices thereof. It should be mentioned here that, e.g. by choice of one or more of the several means discussed above, the open-structured areas of ceramic chips can be varied not only in toto but that different areas and portions of areas may be more or less porous than others. This enables the production of chips in which the portions of the porous strata adjacent the exposed end faces thereof are less porous or have finer pores than the portions lying nearer the center of the chips.

Further, it will be understood that there are available commercially many media or vehicles which can be used for forming films and/or making screen printing compositions from the particles according to the present invention and that many more such vehicles are known to those skilled in the art. Essentially, the purpose of such a medium or vehicle is to suspend the particles and provide a temporary or fugitive bond therefor during formation of leaves and/or layers and the consolidation of a plurality thereof into green bodies prior to sintering. In the sintered bodies the temporary or fugitive bond, as well as any combustible particulate material used, has disappeared. Accordingly, the medium or vehicle used is a matter of choice or convenience and in most instances any change in the composition bonded thereby will require some change or modification, e.g. adjustment of viscosity, in any medium or vehicle employed.

Firing of small ceramic units or chips to sinter them into unitary bodies is preferably carried out in a kiln. As electrically heated tunnel kiln or furnace is preferred but other kilns or other heating means may be employed. Ordinarily an oxidizing atmosphere is used but, when convenient, other atmospheres can be employed. The temperature, atmosphere, and the time of firing will depend on the ceramic compositions employed. Those skilled in the art are familiar with such details, as pointed out above, and with the face that in general the sintering time necessary varies inversely with the temperature and vice versa. As indicated above, a prolonged period of heating at relatively low temperatures is preferred for removal of the temporary bonds used in the leaves and printed areas and any burn-out particles employed. If too rapid heating is employed expansion of gases formed in the decomposition or burning of these materials may rupture the chips.

In FIG. 6 there is illustrated a typical ceramic multilayer circuit structure 50 has a ceramic matrix 52 and a plurality of conductors 54 extending into and through the matrix. The thickness of both conductors and matrix is exaggerated in FIG. 6 for convenience in viewing. Hitherto such structures have been expensive to produce and normally would be made by screen printing a metallic paste containing a noble metal such as palladium or platinum in the desired conductor patterns on sheets of desired thickness of a temporary bonded, electrically insulating, ceramic material such as alumina powder, consolidating the several sheets, and sintering the alumina sheets into a unitary body.

As mentioned above, such ceramic multilayer circuit structures may also be produced by techniques essentially similar to the processes disclosed above for producing monolithic capacitors. The necessity for using expensive noble metals as conductors is thus avoided since firing of metal and sintering the ceramic concurrently is not necessary. One method for producing such a structure as that shown in FIG. 6 by the technique of the present invention will be briefly described with reference to FIG. 7.

The sheets or films A, B, and C shown in FIG. 7 are formed in the desired size, shape, and thickness by casting, molding, or the like a desired electrical insulating, ceramic composition, for example finely divided alumina, using a resin, ethyl cellulose, or the like as a temporary bond therefor. pseudoconductors following the paths of the desired conductors in and/or on the structure as shown at 60 are then screen printed on the sheets or films using, for example a ceramic material in a suitable vehicle or squeegee medium, the ceramic material being one, e.g. coarser alumina powder, which upon firing to sintering temperature will develop an open structure. The sheets are assembled, consolidated, and heated to sinter them into a unitary body, all in the same manner as described above in connection with the production of monolithic capacitors. As with the latter, the unitary or monolithic body produced by heating comprises a dense matrix of the ceramic insulating composition having therein open-structured areas of ceramic material, which may be the same or different in composition, a substantial portion of the volume of such areas comprising interconnected voids. Each of said areas extends to at least one region on an outer face, e.g. an edge face, of said body.

Conductors in and through said bodies may be formed by introducing into the open-structured areas a suitable conductive metal in accordance with one of the procedures described below. After such impregnation, leads may be attached, by suitable known means, to exposed conductors where desired and small components such as transistors, diodes, etc. may be soldered at predetermined points, leads therefrom extending if desired, to underlying conductors 54 through holes 62 provided originally in one or more of the ceramic sheets. If desired, one or more of the holes 62 may be filled with the material employed to form the pseudoconductors when such material is applied to the faces of the sheets.

Although other procedures may be employed, a convenient and efficient way to provide conductive metal in the open-structured areas of small, sintered, ceramic bodies or chips or ceramic, multilayer, circuit structures produced as described above is to inject the metal therein. Typical infiltration or injection procedures are set forth in the following examples.

EXAMPLE 6

A plurality of sintered chips made in accordance with Example 1 are placed in a bath of a molten metal alloy consisting of 50% Bi, 25% Pb, 12.5% Cd. The molten metal is held at a temperature from about 100° C to about 125° C in a suitable closed vessel. After introduction of the chips the pressure in the vessel is reduced to evacuate the open-structured strata of the chips and the pressure is then raised to about 14 kg/cm$^2$ to force the molten metal into the interconnecting pores of such strata. The chips after removal from the bath contain electrodes formed by deposit of the alloy in the open-structured strata between the dense dielectric strata and, after the provision of termination electrodes in any desired manner, are satisfactory monolithic capacitors.

It will be understood that other molten metals can be used for impregnation of the open-structured strata areas or strata of ceramic chips of the types described above or of multilayer circuit structures as above described. For example, there may conveniently be used instead of the alloy specified in Example 6: the metals lead, aluminum, copper, zinc, tin and cadmium and alloys containing one or more of these metals. Other metals are also usable but because of their higher cost, higher resistivity, greater ease of oxidation and/or high melting points, they are not as desirable for forming electrodes. Examples of the many other alloys that can be conveniently used are: Pb 25%, Sn 10%, Bi 63%, In 2%, Al 4%, Cu 1%, balance Zn; Cu 28%, Ag 72%, and various brasses and bronzes. As with the relatively pure metals, however, the cost, resistivity, ease of oxidation, and melting point of an alloy affect greatly its desirability for carrying out the present invention.

In general it has been found desirable to employ as internal electrodes or conductors, metals which do not easily wet the ceramic chips and/or circuit boards into which they are injected. By avoiding combinations in which the ceramic is readily wet by the metal it is possible to prevent or minimize undesirable surface deposits of the metal which would require removal to preclude possible shorting.

In the conventional manufacture of monolithic capacitors there is no problem in providing a termination electrode on each end of the capacitor units to electrically connect the exposed internal metal electrodes thereon since the metal electroding pastes commonly employed for this purpose do not require heating to a temperature higher than the melting point of the internal electrodes. The same is true of monolithic capacitors produced by deposition of metal in open-structured strata of fired ceramic chips by any of the procedures described in the said copending application when the melting point of the metal so deposited is higher than the temperature required to supply the termination electrodes. When, however, as may occur in carrying out the present process, the metal deposited in the open-structured areas or strata of ceramic chips or circuit boards is liquid at a temperature equal to or lower than the temperature employed in applying the termination electrodes, the provision of the latter may present problems.

In the manufacture of monolithic capacitors by the process of the present invention it has been found useful in many cases to provide penetrable barriers at the ends of the ceramic chips before injecting molten metal into the open-structured strata of the chips. Such barriers should be easily provided, should be of material having a melting point higher than the temperature at which the metal internal electrodes are injected, and should be resistant to attack or dissolution in the bath of molten metal used for the internal electrodes. They allow evacuation of air from the open-structured areas or strata of fired ceramic chips such as those produced in accordance with any of Examples 1–5 and the injection therein of molten metal to form interior electrodes. They also serve to restrict flow from such areas or strata when the pressure in the vessel is released. Similar results are obtained by the use of such barriers on the desired faces of multilayer circuit structures according to the invention.

Suitable penetrable barriers can be formed in several ways. For example, when low-melting metals are used for infiltration of the unitary ceramic bodies a coating of a commercial palladium-silver or palladium-gold electroding paste can be applied to the surfaces of sintered chips at which porous strata are exposed and fired in the conventional manner. The coherent end electrode thus formed is penetrable to the molten metal.

When higher temperatures are required for infiltration of metal into the porous areas or strata of ceramic bodies, it has been found feasible to apply over such areas or strata on faces of the bodies a coating of a ceramic material which is fired to form a penetrable, porous, ceramic barrier. The ceramic material may be applied to the green ceramic chips and fired at the same time as the latter or may be applied to the already sintered chips and then fired.

The use of an end or termination electrode as a penetrable barrier is described in the following example.

EXAMPLE 7

Porous end termination electrodes are applied to a plurality of sintered ceramic chips substantially like those produced in accordance with Example 1 by coating the end faces (i.e. the faces on which the porous strata are exposed) of the chips with a commercial palladium-silver electroding paste (DuPont No. 8198) and firing the thus-coated chips at about 880° C, the firing cycle being about 1 hour.

Using apparatus similar to that used in Example 6, the chips are placed in a heated pressure vessel above a bath of molten tin held at about 315° C. The vessel is closed and through a suitable connection the interior of the vessel is evacuated to a pressure of about 60 mm of mercury to remove air from the porous strata of the chips. The chips, which have now been sufficiently heated so that no substantial thermal shock will result, are then lowered into the tin bath and the pressure in the vessel is raised, by supplying a compressed gas, such as nitrogen, thereto, to about 17.5 kg/cm$^2$. The chips are then removed from the melt and after cooling in the vessel to below the melting point of tin the gas pressure in the vessel is released and the chips are withdrawn from the vessel, adhering tin being removed if necessary. Microscopic inspection of broken chips reveals that tin has been forced into the porous strata thereof and the impregnated chips are very satisfactory monolithic capacitors.

As indicated above, the penetrable barriers employed in injecting or impregnating open-structured areas need not be electrically conductive, termination electrodes. The following three examples illustrate this.

EXAMPLE 8

Unfired ceramic blocks or chips such as ones prepared in accordance with Example 4 are employed. The end faces of a plurality of the chips, i.e. the surfaces at which the alternate layers of screened-on composition are exposed, are coated, conveniently by painting, with the same screen printing composition as is applied to the leaves of the resin-bonded, dielectric, ceramic composition. The coated chips are then subjected to heating in air to eliminate the combustible materials and fired in air at about 1325° C to sinter the ceramic. The resulting fired ceramic chips have alternate dielectric strata and open-structured strata and end barriers which are permeable to molten metal.

The fired chips are impregnated with molten tin in the manner described in Example 7. After removal of the metal-impregnated chips from the pressure vessel and cooling, the ceramic barriers and any undesired metal adhering to the surfaces of the chips are removed, for example, by sandblasting, and electrically conducting termination electrodes are applied in accordance with any desired procedure. The resultant monolithic capacitors are very satisfactory.

EXAMPLE 9

Unfired ceramic blocks or chips such as ones produced in accordance with Example 5 are used. In procedure similar to that in Example 8, the end faces of a plurality of the chips are coated, by painting or dipping, with the liquid composition used in Example 5 for casting the sheets employed in forming the porous strata in the chips. The coated chips are then heated in air to burn out the combustible materials and sintered in the manner described in Example 5 to obtain small ceramic bodies with porous strata that can be injected with metal through the porous, open-structured, ceramic barriers formed during sintering.

The fired chips are impregnated with a molten metal alloy consisting of 72% Ag and 28% Cu using essentially the procedure described in Example 7. The temperature of the alloy during impregnation is preferably about 880° C. When the chips are impregnated and cooled, and after sandblasting to remove the ceramic barriers if this is necessary to obtain good electrical contact with the internal electrodes, conductive end terminations are applied to form monolithic capacitors.

In the two immediately preceding examples the ceramic barriers are applied to the end surfaces of the ceramic chips before the latter are sintered and are thus sintered at the same time. In the following example a penetrable ceramic barrier is applied to the chips subsequent to sintering them.

EXAMPLE 10

A readily spreadable paste is prepared by blending finely divided borosilicate glass having a melting point of about 1080° C in about a 1:2 weight ratio with a liquid vehicle formed from 80 ml pine oil, 14 g acrylic resin, 1.5 g lecithin dispersing agent and sufficient, about 1 to 2 g, ethyl cellulose to impart the desired viscosity. This paste is applied by spreading it on the end faces (where the porous strata are exposed) of sintered ceramic chips such as are produced by Example 5. The coated chips are then heated to about 790° C to burn off the vehicle of the applied paste and provide a porous, sintered glass barrier on the chip end faces.

The thus-prepared chips are impregnated with molten lead by the same procedure employed in the metal impregnation of chips described in Example 7 the temperature of the lead bath during impregnation being about 450° C. After sandblasting or otherwise removing the glass barriers and any undesired surface metal deposits the chips may be formed into satisfactory monolithic capacitors by providing end termination electrodes by any known or desired procedure.

Extensive experiments have shown that by the process of the present invention monolithic capacitors with internal electrodes of infiltrated base metal can be produced with capacitances substantially the same as those of monolithic capacitors of the same size and number of layers produced by conventional processes with noble metal internal electrodes. This has been demonstrated with dielectric compositions having relatively high dielectric constants as well as ones with relatively low dielectric constants.

The structure obtained when a permeable barrier is provided on an end face of a ceramic chip preparatory to forming a monolithic capacitor is illustrated in FIG. 8 of the accompanying drawings. In this figure, which is a fragmentary, enlarged sectional view, the strata 70 represent sintered ceramic dielectric material, the numeral 71 designates the open-structured strata, alternating with the first-mentioned strata, into which molten metal is injected to form internal electrodes, and the numeral 72 designates the open-structured, penetrable barrier through which the molten metal is injected. The showing in FIG. 8 is somewhat diagrammatic since when a ceramic penetrable barrier is used, it is so sintered to the ceramic chip as to be unitary and frequently there is no clear line of demarcation between the barrier and the chip.

As will be clear to those skilled in the art, the permeability of the penetrable barriers employed may be adjusted as desired. This can be done, for example, by the inclusion of greater or lesser amounts of burnout material, such as carbon black, in the compositions used for providing such barriers and/or by adjustment of the particle size of the solid materials in such compositions. Other procedures for such adjustment may be used if desired. It will be understood that in some instances termination electrodes may be applied to bodies, by any desired method, over penetrable ceramic barriers subsequent to the injection of metal therethrough into open-structured areas of the body. However, to ensure good electrical contact of such electrodes with the infiltrated internal electrodes it is frequently desirable to remove the barriers before applying termination electrodes. This can be, as pointed out above, readily accomplished by sand blasting.

Although Examples 6–10 are directed to the production of monolithic capacitors by the injection of metal into the open-structured strata of sintered ceramic chips, it is evident that similar techniques, including the use of penetrable barriers, if desired, may be used in providing conductors in multilayer circuit structures such as are described herein.

The pressure required for the impregnation of open-structured areas of ceramic chips or ceramic multilayer circuit structures with molten metal according to the invention will vary with the size of the voids therein and the size of the interconnections therebetween. Also affecting the required pressure are the viscosity of the molten metal and the surface energy thereof relative to that of the open-structured ceramic. In some cases, it may be necessary to make preliminary experiments to discover the optimum pressure to use. However, it has been found that in the use of metals of medium and low melting points, pressures greater than about 17.5 kg/cm$^2$ are not necessary. It should be understood that the pore or void size in a penetrable barrier may, if desired, be less than that in the open-structured areas of the body on which the barrier is applied.

End or termination electrodes can be formed not only with metallic electroding pastes of conventional types, but also, when suitable, by applying to faces of bodies coatings of air-drying conductive metal paints, electroless nickel, indium-gallium alloy, and sprayed metal. It may be noted that flame- or arc-sprayed metal is usually deposited in a rather porous layer. Hence, such deposits can be used, if desired, as conductive penetrable barriers.

Monolithic capacitors according to the present invention may vary widely in size. Not only may the dimensions of the capacitor be varied, but the number and thickness of the strata therein may also vary. Although in most cases it is preferred to make the dielectric strata thicker than the conductive layers, this is subject to variation as desired. Capacitors as small as 2.0 mm × 3.0 mm × 0.9 mm with 20 dielectric strata as thin as about 0.03 mm and 19 porous strata as thin as about 0.015 mm can be readily made, and larger ones are, of course, possible. Capacitors of any desired capacitance may be obtained according to the invention by proper choice of dielectric material and the size, thickness, and number of the strata. It will be understood that one or more extra or additional dielectric leaves or sheets may be placed at the bottom and/or top of a stack of alternated dielectric leaves or sheets and leaves or sheets containing a ceramic composition adapted to form porous strata. This is often done to give additional mechanical strength to the capacitors and/or to adjust their thickness. An unprinted leaf or leaves of a dielectric ceramic composition can be used. However, the presence of a printed ceramic film on the top dielectric film or leaf of such a stack will ordinarily not be detrimental since after sintering the resultant exposed porous deposit will either not hold an electrode material or such material can be easily removed, for example by sanding.

In the foregoing description and the examples, the leaves of dielectric and/or potentially porous ceramic and the capacitors formed therefrom are rectangular. However, the present invention comprehends capacitors of other shapes. Thus, if desired, monolithic capacitors according to the invention may be triangularly shaped. In such case, obviously, alternate porous strata and the electrodes formed therein can not be exposed on opposite edge faces. Consequently, it will be understood that in the appended claims the term "edge region" is used comprehensively to indicate an area on an edge face of a body regardless of the geometry of the body and whether it has one or a plurality of edges.

The terms of position or direction, such as upper, lower, left, right, etc., used herein are with reference to the accompanying drawings and should not be interpreted as limiting the invention or requiring any specific positioning of the capacitors in use.

Except as otherwise indicated, ratios, percentages, and parts referred to herein are ratios, percentages, and parts by weight.

It will be evident from the foregoing description that many variations and modifications of the present invention are possible without departing from the spirit thereof. For example, instead of using leaves of temporarily bonded, powdered dielectric or insulating ceramic material which are formed as distinct entities, sheet-like films of such material in a suitable medium or vehicle may be formed by screen printing on underlying sheets or layers. Also, for example, instead of screen printing the compositions which develop porosity on firing, such compositions can be painted on or applied in other ways. Further, although a self-sustaining body is desired for firing, the stack of leaves or of leaves and the layers thereon need not be pressed to consolidate the stack. In some cases, for example, rolling of the stack as it is built up will provide sufficient consolidation. Also, if desired, the open-structured areas of strata can be partially filled with metal by one of the procedures described in the said copending application Ser. No. 134,689 and additional metal may be injected into the partially filled areas or strata by the process of the present invention. In such case, the metal injected or infiltrated may be the same as that first introduced or a different metal can be used.

I claim:

1. A sintered, unitary, ceramic body comprising: a plurality of strata of a dense insulating or dielectric ceramic composition, a stratum of open-structured ceramic material between said strata and extending to an edge region of said body, and a penetrable barrier on said body over said region.

2. A body as set forth in claim 1 in which there is more than one of such open structured stratum.

3. A body as set forth in claim 1 in which there are strata of a dense, dielectric, ceramic composition alternating with strata of said open-structured material.

4. A body as set forth in claim 3 in which alternate open-structured strata extend to different edge regions of said body and a penetrable barrier is provided over each of said regions.

5. A body as set forth in claim 4 in which said penetrable barriers are end termination electrodes.

6. A body as set forth in claim 4 in which said penetrable barriers are ceramic.

7. A body as set forth in claim 1 in which said stratum of open-structured ceramic material contains a plurality of interconnecting pores.

8. A body as set forth in claim 7 in which there are strata of a dense, dielectric, ceramic composition alternating with strata of said open-structured material.

9. A body as set forth in claim 8 in which alternate open-structured strata extend to different edge regions of said body and a penetrable barrier is provided over each of said regions.

10. A body as set forth in claim 9 in which said penetrable barriers are end termination electrodes.

* * * * *

UNITED STATES PATENT AND TRADEMARK OFFICE
CERTIFICATE OF CORRECTION

PATENT NO. : 4,071,880

DATED : January 31, 1978

INVENTOR(S) : Truman C. Rutt

It is certified that error appears in the above-identified patent and that said Letters Patent are hereby corrected as shown below:

Column 5, line 25, "sized" has been changed to -- sizes --.

Column 6, line 55, "4.8" has been changed to -- 4.8 g --.

Column 7, line 18, after "alternate", -- dielectric - has been inserted.

Column 8, line 10, " 1 - 1" has been changed to -- 1 - 2 --.

Column 8, line 52, "the" first occurrence should read -- fine --.

Column 8, line 68, "As" has been changed to -- An --.

Column 9, line 8, "face" has been changed to -- fact --.

Column 9, line 18, after "50", -- such as is used for hybrid integrated circuits. The structure 50 -- has been inserted.

Column 10, line 21, after "Pb," -- 12.5% Sn and -- has been inserted.

Signed and Sealed this

Sixth Day of June 1978

[SEAL]

Attest:

RUTH C. MASON
*Attesting Officer*

DONALD W. BANNER
*Commissioner of Patents and Trademarks*